United States Patent [19]

Racy

[11] Patent Number: 4,503,404
[45] Date of Patent: Mar. 5, 1985

[54] PRIMED MICROWAVE OSCILLATOR

[75] Inventor: Joseph E. Racy, Hudson, N.H.

[73] Assignee: Sanders Associates, Inc., Nashua, N.H.

[21] Appl. No.: 473,173

[22] Filed: Mar. 7, 1983

[51] Int. Cl.$^3$ .......................... H03B 5/00; H03B 7/00
[52] U.S. Cl. ............................... 331/96; 331/107 SL; 331/107 G; 330/287
[58] Field of Search ................. 331/55, 56, 96, 107 G, 331/107 DP, 107 SL, 173; 330/286, 287

[56] References Cited

U.S. PATENT DOCUMENTS 4,056,784 11/1977 Cohn .................................... 330/287
4,259,647 3/1981 Chang et al. ............. 331/107 SL X Primary Examiner—Eugene R. LaRoche
Assistant Examiner—Robert J. Pascal
Attorney, Agent, or Firm—Louis Etlinger; Richard I. Seligman

[57] ABSTRACT

A primed oscillator for microwave amplification includes a single tank conductor (16) coupled to a coupling conductor (17) by an interdigitated coupler (26). The coupling conductor (17) is connected to the cathode of an IMPATT diode (22) which is triggered by the application of a back-biasing trigger pulse that biases it into its negative-resistance region. When a keying pulse is applied to the IMPATT diode (22), the diode couples power through the interdigitated coupler (26) to the tank circuit (16) to cause oscillations that are initially in phase with any incoming signals, but the frequency of the oscillations is determined by the configuration of the tank circuit (16), not by the frequency of the incoming signal. If the incoming signal is near enough to the resonant frequency, and if the duration of the keying pulses is short enough, the output of the primed oscillator appears to a band-limited receiver to be an amplified version of the input signal. In another version, the amplifying element is a GaAs FET (66) with a tank conductor (70) connected to its gate. The tank conductor is in turn coupled to a coupling conductor (62) for positive feedback at the resonant frequency of the tank (70).

11 Claims, 4 Drawing Figures

PRIMED MICROWAVE OSCILLATOR

BACKGROUND OF THE INVENTION

The present invention is directed to microwave oscillators. It has particular application to primed oscillators employing low-impedance active elements.

Primed oscillators are often used to provide high levels of amplification for microwave signals. When the primed oscillator is activated, it will begin oscillation in phase with an incoming signal if the amplitude of the signal is sufficient and the coupling to the amplifying device is great enough. One of the difficulties encountered in the use of primed oscillators is that the impedance of the amplifying element typically differs greatly from the impedance of the antenna, and steps must be taken to achieve the requisite coupling.

The matching of impedances has been accomplished by employing separate resonant circuits with different impedances. However, this has presented the problem that the two circuits have to be tuned in tandem during manufacturing. This tuning operation complicates the manufacturing process.

SUMMARY OF THE INVENTION

According to one version of my invention, a planar transmission-line conductor is connected at one end to an amplifying element such as an IMPATT diode, which transfers power onto the conductor to cause oscillations at the resonant frequency of the conductor. The resonant conductor, which thus acts as the tank circuit for the oscillator, has a characteristic impedance that is relatively close to that of the amplifying device for efficient coupling of power into the tank circuit.

To transfer power to a transmission line leading to an antenna, a second planar transmission-line conductor is coupled to the first conductor. It is a resonant line so that it can be used as an impedance transformer, and its characteristic impedance is different from that of the oscillator tank conductor, having such a value that the second conductor can readily achieve an approximate match of the characteristic impedance of the antenna transmission line to the impedance of the diode.

The coupling of the two resonant conductors is preferably produced by both edge coupling and capacitive coupling for transfer of power between the antenna and the oscillator. The coupling between the two resonant circuits is at least critical. As a result, the oscillator can be tuned during manufacturing by adjusting only one of the resonant circuits, e.g., by adjusting the length of one of the conductors.

A different version of my invention also uses a planar transmission-line conductor as a tank circuit. The tank circuit is coupled to a transistor control terminal, such as the gate terminal of a field-effect transistor in a common-source configuration. The tank circuit is edge coupled to an impedance-matching circuit, which is also a planar transmission-line conductor, and which is connected at one end to the transistor's amplifying terminal—that is, to the drain terminal in the case of a common-source configuration. The characteristic impedance of the tank matches the input impedance of the transistor, while the matching circuit is a quarter-wave line whose characteristic impedance matches the output impedance of the transistor to the characteristic impedance of a transmission line that leads from the matching circuit to the antenna.

By virtue of the coupling from the matching circuit to the tank circuit, the amplified signal from the drain terminal is fed back to the tank circuit to maintain oscillation. In this version, there is only one resonant circuit, so tuning is necessary for only one. The transistor power voltage appears on the matching circuit, but it is low enough that it can be blocked by an ordinary microwave capacitor.

The invention is defined more specifically in the claims.

BRIEF DESCRIPTION OF THE DRAWINGS

These and further features and advantages of the present invention are described by reference to the accompanying drawings, in which.

DESCRIPTION OF THE PREFERRED EMBODIMENTS

Figure 1:
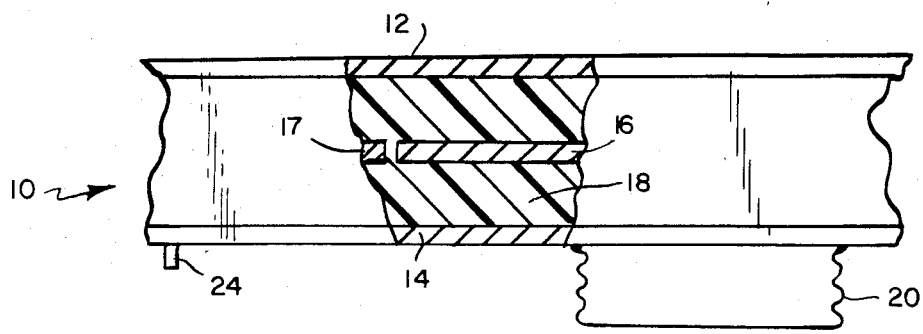
FIG. 1 is a side elevational view, partly in section, of a stripline oscillator that follows the teachings of the present invention.

FIG. 1 is a side view of the oscillator showing its stripline construction. The oscillator 10 includes upper and lower ground-plane conductors 12 and 14, respectively, between which generally planar conductors 16 and 17 are disposed, being separated from the ground planes 12 and 14 by a dielectric layer 18. Signals traveling to and from an antenna (not shown) propagate by way of a coaxial cable connected by a coaxial connector 20 to ground plane 14 and intermediate conductor 16. An IMPATT diode 22 is connected between ground plane 14 and intermediate conductor 17, and triggering pulses for the diode 22 are applied to it by way of a conductor 24 and intermediate conductor 17.

Figure 2:
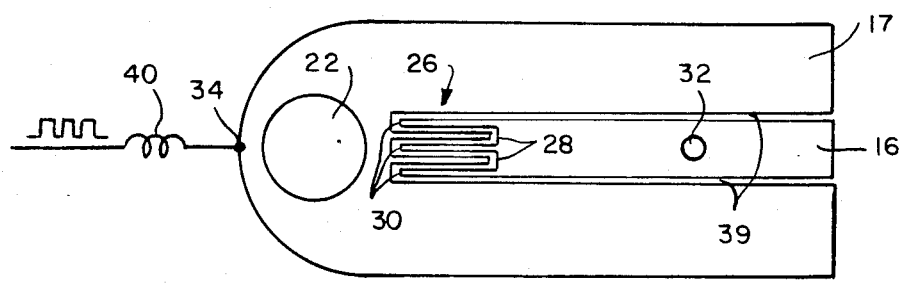
FIG. 2 is a plan view of the oscillator of FIG. 1 with the upper dielectric and ground-plane layers removed to expose the intermediate conductor layer.

The layout of the intermediate conductors 16 and 17 is depicted in FIG. 2. Conductor 16 is elongated and relatively narrow. Its width ordinarily is chosen to minimize its dissipation, i.e., maximize its Q. This narrow width, together with its thickness and spacing from the ground planes 12 and 14, results in a relatively high characteristic impedance. Because of the relatively high impedance, conductor 16 can be tapped reliably to match its input impedance to the characteristic impedance of the coaxial feed line from the antenna. On the other hand, conductor 17 is relatively wide, so it and ground planes 12 and 14 form a transmission line having a lower characteristic impedance. In the middle of its negative-resistance region, IMPATT diode 22 has a negative resistance that is lower in magnitude than the characteristic impedance of conductor 17 but closer to that impedance than to the characteristic impedance of conductor 16.

At one end of intermediate conductor 16, which acts also as an input tank circuit, is an interdigitated capacitor 26 comprising alternating fingers 28 and 30 on conductors 17 and 16, respectively. The capacitor 26 acts as a low-impedance coupler to the low impedance of the diode 22. A high impedance is presented by the other, open end of conductor 16. The length of conductor 16 is approximately one quarter wavelength at a frequency within a range of frequencies to which the primed oscillator is intended to respond. Therefore, it acts as a resonant circuit.

The center conductor of a coaxial feed line from the antenna is electrically connected to conductor 16 at a connection point 32 at which the impedance presented by conductor 16 approximately matches the characteristic impedance of the coaxial line.

Power is applied to the diode 22 by means of conductor 24, which is connected to conductor 17 at point 34 in FIG. 2. DC blocking and microwave coupling are provided by the capacitor 26 and the proximity of the arms of U-shaped conductor 17 to the longitudinal edges 39 of tank-circuit conductor 16.

FIG. 2 also depicts, in diagrammatic form, a radio-frequency choke 40, which typically is connected between conductor 24 of FIG. 1 and a pulsing circuit that keys the primed oscillator on and off.

In operation, a high-voltage keying pulse (approximately one hundred volts) is applied through the radio-frequency choke 40 to conductor 17 and thus to the cathode of the IMPATT diode 22. The keying pulses have a short period but a high duty cycle; that is, the percentage of time during which the keying pulse is at a high voltage is relatively high. The description of the operation will begin, however, during that portion of the cycle at which the keying signal is only high enough to back bias IMPATT diode 22 slightly.

During this part of the cycle, the impedance of the diode 22 is considerably higher than the characteristic impedance of oscillator tank conductor 17. Consequently since both ends of the conductor are terminated in high impedances, it cannot act as a resonant circuit near the frequency of interest, for which the length of conductor 17 is one quarter wavelength.

The capacitor 26 and the close proximity of the arms of U-shaped conductor 17 to the longitudinal edges 39 of the input tank conductor 16 result in a significant coupling of signals from the antenna to the oscillator tank conductor 17 and thus across the terminals of IMPATT diode 22.

When the keying signal goes to its high-voltage state, it biases the IMPATT diode so that it exhibits a negative resistance. As a result, it introduces power into the oscillator tank circuit 17. If the energy per cycle added to the oscillator circuit is greater than the energy lost per cycle in dissipation and transmission to the antenna, the oscillator tank circuit will oscillate. It can be shown that this condition is most likely to occur if the effective resistance of the diode 22 is below the characteristic impedance of conductor 17 but relatively close to it; for oscillation, the magnitude of the diode resistance must be less than the characteristic impedance of conductor 17, but the power coupling from the keying source to the oscillator tank circuit 17 is greatest when the magnitude of the negative resistance equals the characteristic impedance. The relative width of conductor 17 results in a comparatively low characteristic impedance so that this relationship obtains for the high-voltage bias point of the diode 22. (As oscillation ensues, the diode 22 is driven further into its negative-resistance region, in which its resistance may be more than an order of magnitude below the characteristic impedance of conductor 17.) The width of conductor 17 also results in low resistive dissipation.

The coupling of the resonant circuits 16 and 17 is at least critical as a result of the capacitor 26 and the proximity of the arms of conductor 17 to the longitudinal edges 39 of conductor 16. This coupling widens the bandwidth of the oscillator. Thus, the high degree of coupling, in addition to presenting a significant-amplitude signal on conductor 17, increases the sensitivity of the oscillator to frequencies on the outer edge of the intended frequency range.

It is possible to depart from the design depicted in FIGS. 1 and 2 and conduct the signal directly from conductor 17 to the transmission line leading to the antenna. However, this ordinarily is not feasible, because it is not desirable to apply the high-voltage keying signal to the antenna. With the antenna coupled to the input tank conductor 16, the oscillator signal is passed, but the keying signal is blocked.

The oscillating signal on oscillator tank conductor 17 is coupled to input tank conductor 16. The resonant frequency of both circuits is determined by their lengths and the extent of coupling between them; that is, the frequency is not determined by the frequency of the input signal, which is quickly overwhelmed by the oscillator signal. However, the initial phase of the oscillator signal is determined by the phase of the incoming signal, and the on time of the keying signal is not long enough to permit a significant phase difference to accumulate between the input signal and the oscillator signal. Before a significant phase difference develops, the keying signal returns to a low value, turning off the oscillator just long enough to permit the oscillator signal to die out. It then reverts to its high-voltage state, beginning oscillation in phase with the received signal again. The result is a signal that has a high power density at the frequency of the incoming signal. In fact, the resultant signal appears to a band-limited receiver to be an amplified version of the incoming signal. As a result, the primed oscillator can act as a high-gain amplifier to frequencies within a neighborhood of the resonant frequency of the oscillator.

The version of the oscillator described above has a significant advantage over prior-art microwave oscillators. It preserves the necessary isolation of the keying signal from the antenna. Yet it is not necessary that the individual resonant frequencies of the two resonant conductors 16 and 17 be identical; since they are at least critically coupled, and preferably overcoupled, their individual resonant frequencies need only be near to each other. Thus, tuning of the circuit during manufacture is greatly simplified; as a practical matter, it can be limited to adjusting the length or termination of the input tank conductor 32.

A primed oscillator embodying these teachings has been constructed and operates successfully in the lower X band. The conductors were made of copper, the ground planes being separated by a distance of 0.076 cm. The thickness of the conductors 16 and 17 in the intermediate plane was 0.0036 cm., the overall length of the conductors in the intermediate plane being approximately 1.0 cm. The widths of the legs of the larger conductor 17 were about 0.15 cm. The length and width, respectively, of conductor 16, including its interdigitation portion, were about 0.76 cm. and 0.089 cm., respectively.

Figure 4:
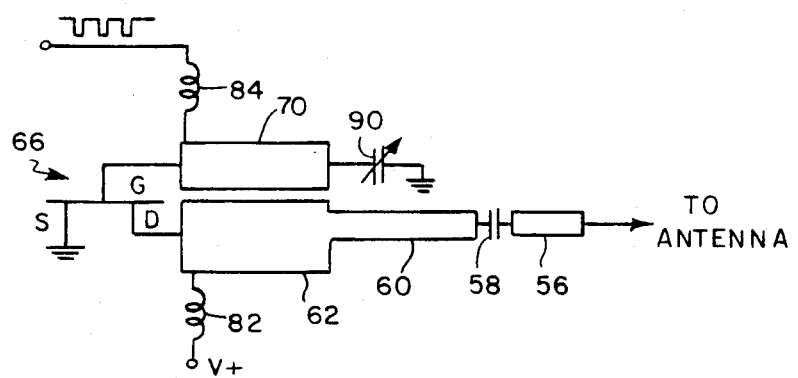
FIG. 4 is a schematic diagram of the oscillator of FIG. 3.
Figure 3:
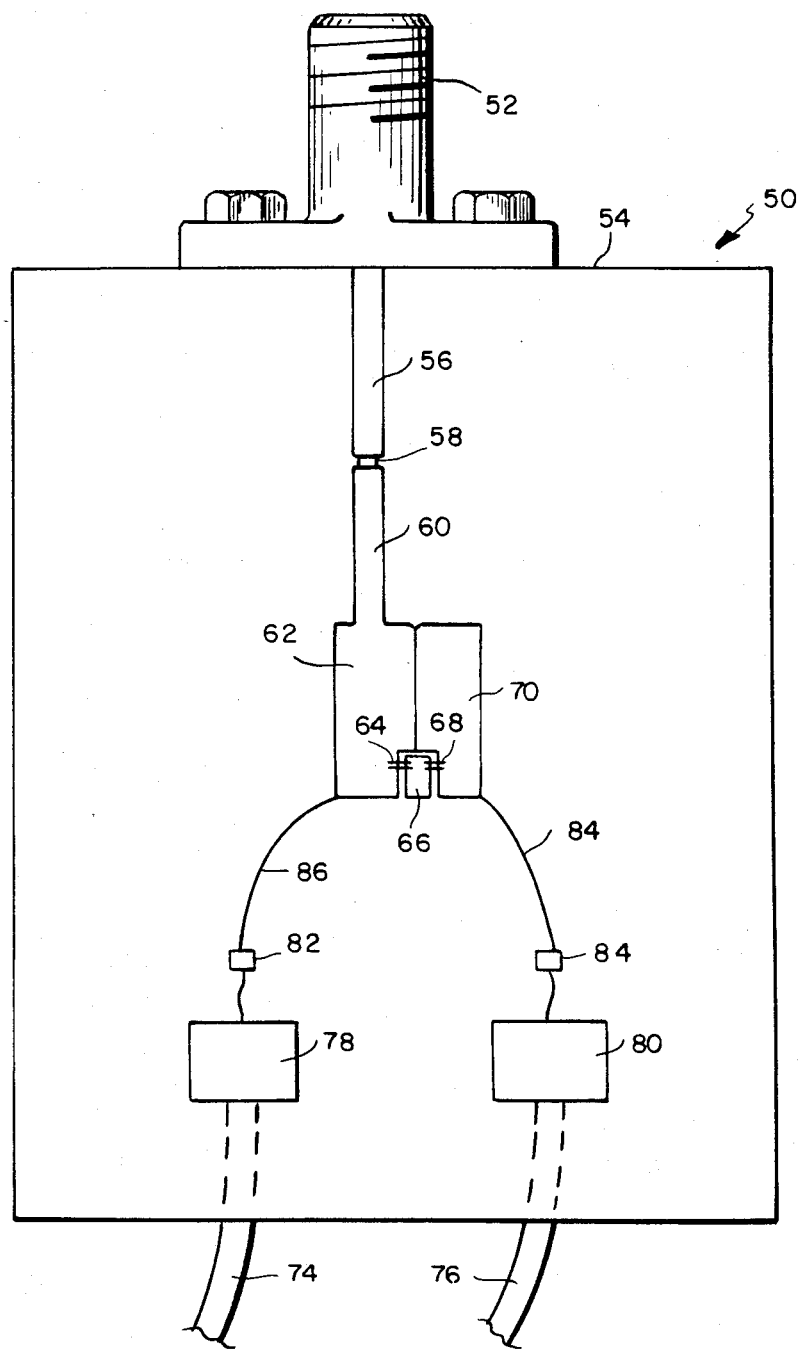
FIG. 3 is a plan view of another embodiment of the invention with the upper dielectric and ground-plane layers removed to expose the intermediate conductor layer.

A variation of the oscillator of FIGS. 1 and 2 is shown in FIGS. 3 and 4. This primed oscillator employs a gallium arsenide (GaAs) field-effect transistor. In principle, other types of transistors, both field-effect and bipolar, can be employed in this type of oscillator, but gallium arsenide is the transistor material of choice for the present application because of its high carrier mobility. An elongated resonant tank conductor in the gate circuit of the FET determines the frequency at which the circuit is to oscillate, and an elongated coupling conductor connected to the drain of the FET has a longitudinal edge disposed in close proximity to that of the tank conductor so that it couples the amplified output signal to the tank circuit for in-phase feedback at the resonant frequency.

Like the oscillator of FIGS. 1 and 2, the oscillator of FIGS. 3 and 4 is a microstrip device; i.e., it includes two generally parallel relatively wide ground-plane conductors as well as narrower conductors. The narrower conductors are disposed between the ground-plane conductors and define the various signal paths. However, it is also possible to apply the teachings of the invention by employing stripline technology.

FIG. 3 is a diagram of the physical layout of this oscillator with the upper dielectric layer and ground plane removed to show the intermediate conductor. A coaxial connector 52 is mounted on a lower dielectric layer 54 with its outer conductor connected to the ground planes and its inner conductor continuing in an elongated input-output transmission line disposed on the lower dielectric layer. A microwave capacitor 58 couples transmission line 56 to a further transmission line 60 connected to a quarter-wave coupling conductor 62, which is connected by double leads 64 to the drain terminal of a GaAs FET 66. FET 66 is connected in a common-source configuration, so the drain terminal is the amplification terminal of the transistor 66. Conductor 62 is of such width and thickness and so spaced from the ground conductors as to have a characteristic impedance that is nearly the geometric mean of the drain impedance of the FET and the characteristic impedance of transmission line 50.

Further leads 68 connect the gate gate terminal of the FET to a tank conductor 70 whose characteristic impedance is greater than the gate input impedance of the FET 66. In the common-source configuration, the gate terminal is the control terminal of the transistor 66. The length of tank conductor 70 is chosen so that a resonant frequency for microwaves propagating longitudinally along it falls within the range of frequencies that the primed oscillator is to amplify. The source and substrate of the FET 66 are connected to the lower ground plane.

Bias voltages are brought into the oscillator by leads 74 and 76, which extend below the lower ground plane and are fed through holes in it to conductive pads 78 and 80, respectively, which in turn are connected to radio-frequency chokes 82 and 84, respectively. A lead 86 connects choke 82 to the coupling conductor 62, while another lead 88 connects the other choke 84 to the tank conductor 70.

The bias voltage on lead 88 is applied in pulses to turn the primed oscillator on and off as is required if the oscillator is to act as a microwave amplifier.

This circuit is shown schematically in FIG. 4, which, in addition to depicting the several elements in FIG. 3, also depicts a trimmer capacitor 90 connected to the end of tank conductor 70 opposite the gate of FET 66. The capacitor extends between the tank conductor and the lower ground plane and is used to tune the oscillator.

The operation of the oscillator will be described by reference to FIG. 4. For a small portion of each keying cycle, the keying signal applied to the radio-frequency choke 84 biases the gate of the transistor 66 to its non-conducting state. Consequently, the transistor does not amplify during this period. Signals from the antenna are transmitted across microwave capacitor 58 and along line 60 to the quarter-wave coupling conductor 62, which has a characteristic impedance of about 11 ohms for matching the 50-ohm line 60 to the output impedance of transistor 66. Because of the edge coupling of the coupling conductor 62 to the tank conductor 70, some of the received power is transmitted into tank circuit 70. While the keying signal is at its turnoff level, the signals appearing throughout the system have a frequency determined by the frequency of the incoming microwave signal.

The frequency of the incoming signal typically differs from the resonant frequency of tank conductor 70. However, if the incoming signal is within the intended range of operational frequencies, it will still cause a relatively high-amplitude signal to appear on tank conductor 70 because the signal is near the resonant frequency of that conductor.

Eventually, the keying signal applied to the gate of transistor 66 will change state, biasing transistor 66 to its amplifying region. When the change of state first occurs, the incoming microwave signal that appears in tank circuit 70 as a result of the incoming microwave signal controls the current flowing in the gate-to-source channel of the transistor. At the microwave frequencies of interest, the output impedance of the transistor is low, and the coupling conductor 62 matches this low impedance to the characteristic impedance of line 62. Accordingly, the signal on the gate of the transistor 66 is amplified and efficiently transmitted along coupling conductor 62 to transmission line 60 and onto the antenna.

Initially, the phase of this signal is determined by the incoming signal from the antenna; the signal that has been coupled to the tank circuit 70 controls the gate of transistor 66. However, the signal at some points along coupling conductor 62 is in phase with that on tank conductor 70. An amplified signal is thus coupled back into the tank circuit 70 in phase with the signal existing on that conductor, and this is the requirement for oscillation. The frequency of this oscillation, of course, is determined by the length of tank conductor 70 and by its terminations, not by the frequency of the incoming signal. The frequency of the output signal is thus independent of the incoming signal, but the phases of the signals are initially the same.

The keying-signal pulses do not last long enough to permit a substantial phase difference to accumulate between the incoming signal and the output signal, and when the keying signal again turns the transistor off, the oscillations die out, and the signals in the circuit are again in phase with the incoming signal.

The result is a signal that has a significant power density at the frequency of the incoming signal and appears to a band-limited receiver to be an amplified version of the incoming signal. Thus, like the primed oscillator of FIGS. 1 and 2, the oscillator of FIGS. 3 and 4 operates as a high-gain microwave amplifier.

What is claimed as new and desired to be secured by Letters Patent of the United States is:

1. A primed oscillator for amplifying microwave signals that are received along an input-output transmission line and fall within a range of microwave frequencies, said oscillator comprising:

A. at least one generally planar ground-plane conductor;

B. a transistor configured for producing at an amplifier terminal thereof an amplified version of a signal appearing at a control terminal thereof;

C. a generally planar elongated tank conductor connected at one end to said control terminal of said transistor and being of such length as to support resonance of longitudinally propagating microwaves at a resonant frequency within said frequency range;

D. a generally planar elongated coupling conductor connected at one end to said amplifier terminal of said transistor, said coupling conductor being so configured in cross section and so spaced from said ground-plane conductor as to have a characteristic impedance for matching the output impedance of the amplifier terminal of said transistor to the characteristic impedance of said input-output transmission line, longitudinal edges of said coupling and tank conductors being disposed for edge coupling therebetween and in-phase feedback at said resonant frequency; and E. means for coupling said coupling conductor to the input-output transmission line.

2. A primed oscillator as recited in claim 1 wherein said transistor is a field-effect transistor.

3. A primed oscillator as recited in claim 2 wherein said transistor is arranged in a common-source configuration, said control terminal is the gate terminal of said transistor, and said amplifier terminal is its drain terminal.

4. A primed oscillator as recited in claim 3 in which there are two planar ground-plane conductors disposed parallel to each other, said coupling and tank conductors being disposed between said ground-plane conductors and extending parallel thereto.

5. A primed oscillator as recited in claim 2 in which there are two planar ground-plane conductors disposed parallel to each other, said coupling and tank conductors being disposed between said ground-plane conductors and extending parallel thereto.

6. A primed oscillator as recited in claim 1 wherein said tank conductor is connected to said control terminal and said coupling conductor is connected to said amplifier terminal.

7. A primed oscillator as recited in claim 6 in which there are two planar ground-plane conductors disposed parallel to each other, said coupling and tank conductors being disposed between said ground-plane conductors and extending parallel thereto.

8. A primed oscillator as recited in claim 1 in which there are two planar ground-plane conductors disposed parallel to each other, said coupling and tank conductors being disposed between said ground-plane conductors and extending parallel thereto.

9. A primed oscillator for amplifying microwave signals that are received along an input-output transmission line and fall within a range of microwave frequencies, said oscillator comprising:

A. at least one generally planar ground-plane conductor;

B. a generally planar elongated coupling conductor of such length as to support resonance of longitudinally propagating microwaves at a resonant frequency within said frequency range, said coupling conductor being so configured in cross section and so spaced from said at least one ground-plane conductor as to have a characteristic impedance that enables efficient coupling of signals at said resonant frequency between said input-output transmission line and said coupling conductor at a connection point therealong, said coupling conductor being adapted for connection to the input-output transmission line at said connection point;

C. a negative-resistance electronic element electrically connected at one terminal to said ground-plane conductor and exhibiting negative small-signal resistance; and D. a generally planar elongated tank conductor of such length as to support resonance of longitudinally propagating microwaves at the resonant frequency, said tank conductor being connected at one end to the other terminal of said negative-resistance element and so configured in cross section and spaced from said ground-plane conductor as to have a characteristic impedance between the characteristic impedance of said coupling conductor and the absolute value of the negative resistance of said negative-resistance element, said oscillator tank conductor extending along a major portion of both longitudinal edges of said input-tank conductor for coupling of microwave energy between said coupling conductor and said tank conductor, said input and oscillator tank conductors being at least critically coupled.

10. A primed oscillator as recited in claim 9 wherein the peripheries of said tank and coupling conductors form an interdigitated capacitor for coupling microwave energy between said coupling conductor and said tank conductor.

11. A primed oscillator for amplifying microwave signals that are received along an input-output transmission line and fall within a range of microwave frequencies, said oscillator comprising:

A. at least one generally planar ground-plane conductor;

B. a generally planar elongated coupling conductor of such length as to support resonance of longitudinally propagating microwaves at a resonant frequency within said frequency range, said coupling conductor being so configured in cross section and so spaced from said at least one ground-plane conductor as to have a characteristic impedance that enables efficient coupling of signals at said resonant frequency between said input-output transmission line and said coupling conductor at a connection point therealong, said coupling conductor being adapted for connection to the input-output transmission line at said connection point;

C. a negative-resistance electronic element electrically connected at one terminal to said ground-plane conductor and exhibiting negative small-signal resistance; and D. a generally planar elongated oscillator tank conductor of such length as to support resonance of longitudinally propagating microwaves at the resonant frequency, said tank conductor being connected to the other terminal of said negative-resistance element and so configured in cross section and spaced from said ground-plane conductor as to have a characteristic impedance between the characteristic impedance of said coupling conductor and the absolute value of the negative resistance of said negative-resistance element, its periphery and that of said coupling conductor being complementarily configured to form an interdigitated coupler for coupling of microwave energy between said coupling conductor and said tank conductor, said coupling and tank conductors being at least critically coupled.

* * * * *